United States Patent [19]
Brown et al.

[11] Patent Number: 6,130,601
[45] Date of Patent: Oct. 10, 2000

[54] THICK-FILM RESISTOR HAVING CONCENTRIC TERMINALS AND METHOD THEREFOR

[75] Inventors: Vernon L. Brown, Barrington; Gregory J. Dunn, Arlington Heights; Lawrence E. Lach, Chicago, all of Ill.

[73] Assignee: Motorola, Inc., Schaumburg, Ill.

[21] Appl. No.: 09/421,182

[22] Filed: Oct. 19, 1999

Related U.S. Application Data

[62] Division of application No. 08/976,467, Nov. 24, 1997, Pat. No. 5,994,997.

[51] Int. Cl.[7] .................................................. H01C 1/012
[52] U.S. Cl. ........................... 338/307; 338/309; 338/320; 338/328; 29/620; 29/621
[58] Field of Search ..................................... 338/307, 309, 338/312, 314, 328, 320; 29/610.1, 620, 621

[56] References Cited

U.S. PATENT DOCUMENTS

| | | | |
|---|---|---|---|
| 3,444,616 | 5/1969 | Ferretti et al. ............................. | 29/621 |
| 4,300,115 | 11/1981 | Ansell et al. . | |
| 4,301,439 | 11/1981 | Johnson et al. ........................... | 338/195 |
| 4,725,925 | 2/1988 | Tanaka et al. ............................ | 361/774 |
| 4,777,718 | 10/1988 | Henderson et al. . | |
| 4,870,746 | 10/1989 | Klaser ....................................... | 29/620 |
| 4,902,610 | 2/1990 | Shipley . | |
| 5,162,144 | 11/1992 | Brown et al. . | |
| 5,164,699 | 11/1992 | Smith et al. . | |
| 5,246,817 | 9/1993 | Shipley, Jr. . | |
| 5,260,170 | 11/1993 | Brown . | |
| 5,347,258 | 9/1994 | Howard et al. .......................... | 338/333 |
| 5,603,847 | 2/1997 | Howard et al. . | |
| 5,661,450 | 8/1997 | Davidson ................................. | 338/320 |
| 5,889,261 | 3/1999 | Boardman ................................ | 338/308 |

*Primary Examiner*—Karl D. Easthom
*Attorney, Agent, or Firm*—Douglas D. Fekete

[57] ABSTRACT

A thick-film resistor and a process for forming the resistor to have accurate dimensions, thereby yielding a precise resistance value. The resistor generally includes an electrically resistive layer and a pair of terminals, a first of which is surrounded by the second terminal, so as to form a region therebetween that surrounds the first terminal and separates the first and second terminals. The terminals are preferably concentric, with the second terminal and the region therebetween being annular-shaped. The resistive layer electrically connects the first and second terminals to complete the resistor. Each of the terminals has a surface that is substantially parallel to an upper and/or lower surface of the resistive layer and contacts the resistive layer. The surfaces of the terminals may be embedded in the resistive layer by printing the resistive material over the terminals, or may contact the upper or lower surface of the resistive layer by locating the terminals above or below the resistive layer. In each of these embodiments, the terminals are not limited to having edge-to-edge contact with the resistive layer, such that the interfacial resistance therebetween is minimized.

20 Claims, 2 Drawing Sheets

THICK-FILM RESISTOR HAVING CONCENTRIC TERMINALS AND METHOD THEREFOR

The present application is a division of U.S. application Ser. No. 08/976,467, U.S. Pat. No. 5,994,997 filed on Nov. 24, 1997, which is hereby incorporated by reference, and priority thereto for common subject matter is hereby claimed.

This invention was made with Government support under Agreement No. F33615-96-2-1838 awarded by DARPA. The Government has certain rights in the invention.

BACKGROUND OF THE INVENTION

1. Field of the Invention

The present invention generally relates to thick-film circuit components and their fabrication. More particularly, this invention relates to a thick-film resistor whose electrical width and length are precisely determined by concentric terminals using photolithography techniques, thereby avoiding the variability associated with conventional screen printed resistors.

2. Description of the Prior Art

Thick-film resistors are employed in electronic circuits to provide a wide range of resistor values. Such resistors are formed by printing, such as screen printing, a thick-film resistive paste or ink on a substrate, which may be a printed wiring board, flexible circuit, or a ceramic or silicon substrate. Thick-film inks are typically composed of an electrically resistive material dispersed in an organic vehicle or polymer matrix material. After printing, the thick-film ink is typically heated to convert the ink into a suitable film that adheres to the substrate. If a polymer thick-film ink is used, the heating step serves to dry and cure the polymer matrix material. Other thick-film inks must be sintered, or fired, during which the ink is heated to burn off the organic vehicle and fuse the remaining solid material.

The predictability and variability (or tolerance) of the electrical resistance of a thick-film resistor are dependent on the precision with which the resistor is produced, the stability of the resistor material, and the stability of the resistor terminations. Conventional thick-film resistors are rectangular shape, with "x," "y" and "z" dimensions corresponding to the electrical width (W), electrical length (L) and thickness, respectively, of the resistor. Control of the "x" and "y" dimensions of a thick-film resistor is particularly challenging in view of the techniques employed to print thick-film inks and the dimensional changes that may occur during subsequent processing. For rectangular screen-printed resistors, the x and z dimensions are defined by the resistor screening process, and the y dimension is defined by the termination pattern. Conventional screen printing techniques generally employ a template with apertures bearing the positive image of the resistor to be created. The template, referred to as a screening mask, is placed above and in close proximity to the surface of the substrate on which the resistor is to be formed. The mask is then loaded with the resistive ink, and a squeegee blade is drawn across the surface of the mask to press the ink through the apertures and onto the surface of the substrate.

Compared to many other deposition processes, screen printing is a relatively imprecise process. Screen printed thick-film resistors having adequate tolerances in the x and y dimensions are often physically larger than chip resistors. Resistance value predictability (i.e., the dependability that a 500 $\mu$m-wide, 10 square resistor will have ten times the resistance of a 1000 $\mu$m-wide, 1 square resistor) is generally low, and precise tolerances cannot be maintained at aspect ratios (L/W) below 0.5 squares. As a result, one ink of a given resistivity, requiring one screening, cure and associated process steps, is required for each decade of resistance value needed in a circuit design, which often necessitates the use of three to four inks to complete one circuit. This increases cost and decreases throughput. Predictability and variation of resistance values are also strongly affected by surface planarity and resistor orientation vs. print direction. While resistance tolerances can be improved by laser trimming, such an operation is usually cost prohibitive for complex circuits. As a result, screen printed thick-film resistors have found only limited application.

From the above, it can be seen that present practices involving the fabrication of thick-film resistors can necessitate a compromise between the precision of the resistance value and the physical size of the resistor. In other words, while physically smaller resistors are often preferred to yield a more compact circuit, an undesirable consequence is that resistance values are less predictable due to the dimensional variability of the resistors. In addition, multiple resistive inks, each requiring separate cure and processing steps, are required to produce a circuit having thick-film resistors whose resistance values differ by more than one decade. Accordingly, what is needed is a method for producing thick-film resistors, in which the dimensions of a resistor can be precisely defined so as to achieve more readily a desired resistance value, and by which the resistance values of thick-film resistors formed with a single ink can be accurately achieved over a range of greater than a single decade.

SUMMARY OF THE INVENTION

According to the present invention, there is provided a thick-film resistor whose x (electrical width, or W) and y (electrical length, or L) dimensions can be accurately defined in such a manner as to precisely yield a resistance value even with electrical width and length of less than one millimeter. The resistor can be formed with conventional thick-film resistor inks used to form screen printed thick-film resistors, though the precision of the final dimensions of resistors formed in accordance with this invention is better than that possible for prior art screen printed thick-film resistors. Furthermore, resistance values of greater than a single decade can be accurately achieved for thick-film resistors formed with a single ink without resorting to laser trimming.

The invention generally entails an electrically resistive layer and a pair of terminals, a first of which is surrounded by the second terminal, so as to form a region therebetween that surrounds the first terminal and separates the first and second terminals. The terminals are preferably concentric, with the second terminal and the region therebetween being annular-shaped. The resistive layer electrically connects the first and second terminals to complete the resistor. Each of the terminals has a surface that is substantially parallel to an upper and/or lower surface of the resistive layer and contacts the resistive layer. The surfaces of the terminals may be embedded in the resistive layer by printing the resistive material over the terminals, or may contact the upper or lower surface of the resistive layer by locating the terminals above or below the resistive layer. In each of these embodiments, the terminals are not limited to having edge-to-edge contact with the resistive layer, such that the interfacial resistance therebetween is minimized.

Particular embodiments having the base configuration described above include applying the resistive layer and the terminals on a dielectric layer, such that the terminals are embedded in the resistive layer with the lower surfaces of the terminals coplanar with the lower surface of the resistive layer. In this embodiment, the dielectric layer is preferably plateable and the terminals are plated directly on the dielectric layer, or the terminals may be formed by laminating a conductive foil to the dielectric and subsequently patterning the foil by subtractive etching. A conductor may be provided which makes electrical contact with the first terminal through either the dielectric layer or the resistive layer. In another embodiment, the terminals may be formed on the resistive layer, such that the lower surfaces of the terminals contact the upper surface of the resistive layer. In yet another embodiment, the terminals lie within wells in a photodefinable dielectric layer beneath the resistive layer, and the resistive layer overlies the dielectric layer and the terminals.

According to this invention, plateable and photodefinable resins can be advantageously used to facilitate forming the terminals and electrical conductors to the terminals. Notably, the electrical width (W) and electrical length (L) of a resistor formed in accordance with the above are defined by the placement and shape of the terminals and not by the screen printed lateral dimensions of the resistive layer, such that aspect ratios (L/W) of less than 0.5 squares can be precisely achieved. This feature of the invention enables the manufacture of precision thick-film resistors formed of a single thick-film ink and having resistance values that differ by more than a single decade without laser trimming. Accordingly, this invention overcomes the shortcomings of the prior art with a thick-film resistor whose electrical width and electrical length can both be accurately defined by the placement of the terminals of the resistor, which can be accurately located by plating or subtractive etching to achieve electrical widths and lengths of as little as 0.5 mm and less, while exhibiting predictable resistance values. Furthermore, by locating the terminals within or directly beneath or above the resistive layer, greater surface contact is provided between the terminals and resistive layer, thereby minimizing the interfacial resistance therebetween. In addition to the above, thick-film resistors configured in accordance with the above exhibit no print direction dependence.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE PREFERRED EMBODIMENT

Figure 1:
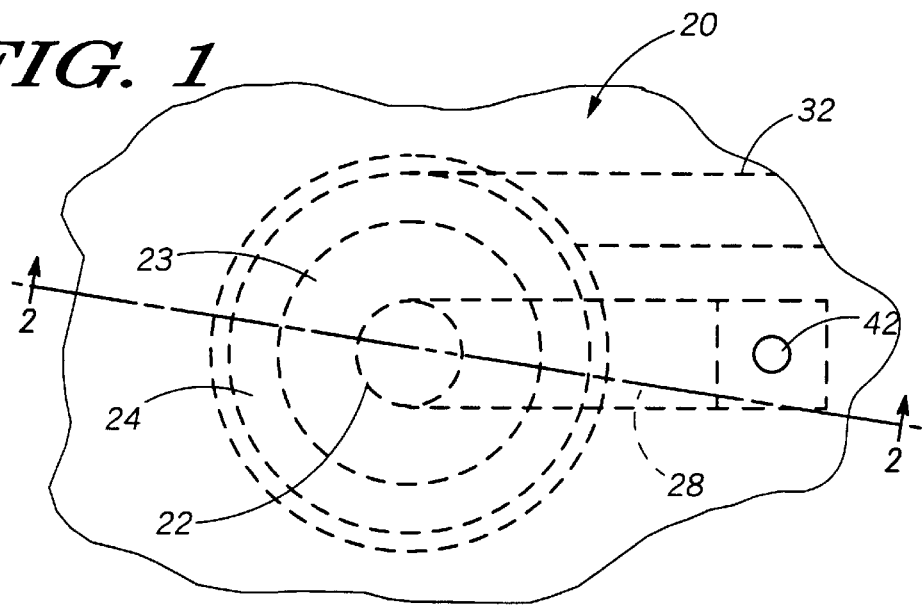
FIG. 1 is a plan view of a terminal pattern for a thick-film resistor in accordance with this invention.

Thick-film resistors in accordance with several embodiments of this invention are generally represented in FIGS. 2 through 5, each of which generally incorporates a concentric annular terminal pattern 20 shown in FIG. 1. While particular resistor configurations are shown in the Figures, those skilled in the art will appreciate that numerous variations and modifications are possible, and such variations and modifications are within the scope of this invention. Furthermore, those skilled in the art will appreciate that the resistors shown can be part of a multilayer construction, with additional dielectric and conductor layers above and/or below those layers containing the resistors.

Referring to FIG. 1, the terminal pattern 20 generally includes inner and outer terminals 22 and 24, respectively. A first conductor 28 is shown as contacting the inner terminal 22, while a second conductor 32 contacts the outer terminal 24. The conductor 28 is shown in FIG. 1 as being electrically connected to a via 42. Through the conductors 28 and 32, the terminals 22 and 24 can be interconnected to circuitry on the same level, to circuitry on a different level through vias, or in any other suitable manner.

In view of the structure shown in FIG. 1, thick-film resistors in accordance with this invention are understood to have concentric terminals 22 and 24 that are spaced apart by an annular-shaped region 23. Notably, the inner terminal 22 has a circular shape, while the outer terminal 24 has an annular shape that is concentric with the region 23. Therefore, current is conducted through a resistor incorporating the terminal pattern 20 in a radial direction, either inward or outward, relative to the inner terminal 22. According to this invention, by locating the terminals 22 and 24 above or beneath an electrically resistive material (e.g., resistive layer 26 of FIG. 2), the effect of interfacial resistance between the resistive material and the terminals 22 and 24 is reduced, thereby promoting the predictability and stability of the resistance value of the resulting thick-film resistor (e.g., resistor 10 of FIG. 2). In addition, the rotationally symmetric design of the terminal pattern 20 essentially negates any effect that orientation of the resistor to the direction in which the resistive ink is printed might have on resistance value.

Figure 2:
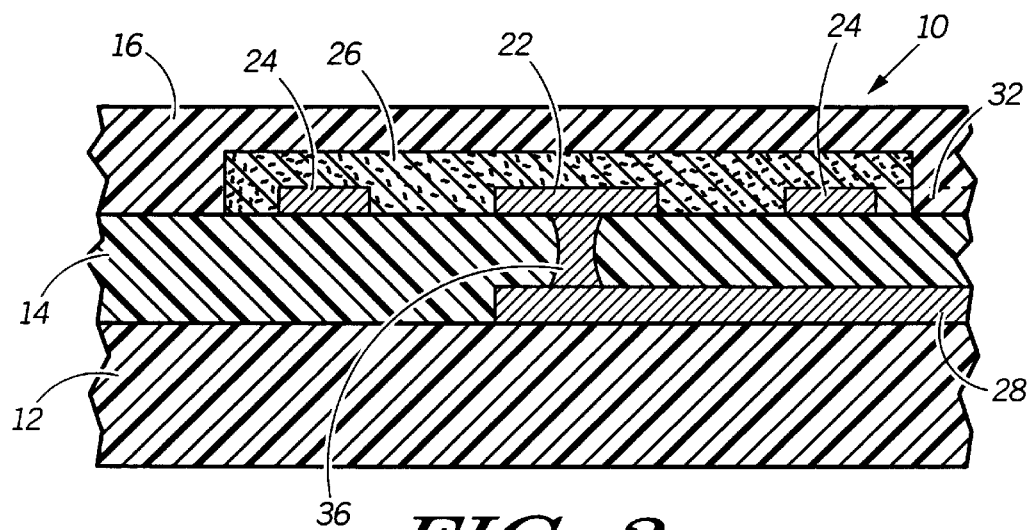
FIGS. 2 through 5 are cross-sectional views of various embodiments for thick-film resistors incorporating the terminal pattern shown in FIG. 1.

Referring to FIG. 2, a resistor 10 is shown in accordance with a preferred embodiment of this invention, incorporating the concentric terminal pattern 20 shown in FIG. 1, over which a resistive layer 26 is formed to electrically connect the terminals 22 and 24. The resistor 10 makes use of dielectric layers 12 and 14 which are plateable or to which conductive foil can be laminated. The dielectric layers 12 and 14 can be formed on any suitable substrate (not shown), such as a printed wiring board, a flexible circuit, a ceramic or silicon substrate, or another dielectric layer or a conductive foil of a multilayer circuit, though other suitable substrates and materials could also be used. The conductor 28 is shown as being formed on the dielectric layer 12. A preferred technique for forming the conductor 28 is to catalyze the surface of the dielectric layer 12, deposit an electroless copper flash on the catalyzed surface, and then electroplate copper on the electroless flash through a plating resist that has been appropriately patterned (a process known as "pattern plating"). For this purpose, the dielectric layer 12 can be formed of photodefinable and plateable resins disclosed in U.S. Pat. No. 5,162,144 to Brown et al., assigned to the same assignee as the present application and hereby incorporated by reference, though other resin compositions could be used. After the resist is stripped, a quick etch can be performed to remove the electroless flash that was not plated. Alternatively, the conductor 28 can be formed by catalyzing and electrolessly plating the dielectric layer 12 with copper as before, but then electroplating the resulting copper flash (i.e., "panel plating"), applying and patterning a photoresist, and then etching the exposed copper plating. Yet another alternative is to subtractively etch a copper foil laminated to the dielectric layer 12.

The dielectric layer 14 is then deposited on the dielectric layer 12 and the conductor 28. The terminals 22 and 24 and conductor 32 are formed on the dielectric layer 14 after contacts 36 and 42 (FIG. 1) are formed in the dielectric layer 14, with the contact 36 serving to electrically connect the inner terminal 22 with the conductor 28. As shown in FIGS. 1 and 2, the conductor 32 is formed to make electrical contact with the outer terminal 24. According to the invention, the terminals 22 and 24 and conductor 32 are preferably formed by any one of the techniques described above for the conductor 28, i.e., catalyze, electrolessly plate, apply resist, and then electroplate, or catalyze, electrolessly plate, electroplate, apply resist and then etch, or laminate and etch. Due to the precision of such processes, the terminals 22 and 24 are precisely formed in terms of their individual dimensions and their concentricity to each other.

Finally, a thick-film resistive ink is printed on the dielectric layer 14 and over the terminals 22 and 24 to form the resistive layer 26 shown, over which a third dielectric layer 16 may be formed. A suitable ink composition is the type containing a polymer matrix in which carbon particles are dispersed to achieve a desired level of conductivity, though other materials could be substituted. A screening mask (not shown) can be used to deposit the thick-film resistive ink over the terminals 22 and 24 and the dielectric layer 14. The screening mask can be a reusable template or stencil of a type known in the art.

In that the electrical width (W) and electrical length (L) of the resistor 10 are both determined by the terminals 22 and 24, which are delineated by high resolution photodefinition, the resistor 10 of FIG. 2 exhibits a highly predictable resistance value and none of the dimensional variability associated with screen printed thick-film resistors of the prior art. The resistor 10 can be as physically small as the edge definition attainable with the photodefinition technique used, enabling the precise formation of resistors having dimensions on the order of 100 micrometers and smaller. The technique by which the resistive ink is deposited need not be highly accurate in the x (electrical width) and y (electrical length) dimensions, though good thickness control is desirable. Using the above-described method, thick-film resistors having aspect ratios less than 0.1 equivalent squares have been produced with excellent predictability and tolerances.

It is believed that the predictability of resistors configured in accordance with this and subsequent embodiments of this invention is attributable in part to the fact that the resistive layer 26 overlaps and has large contact areas with the terminals 22 and 24, so that the interfacial resistance between these structures is minimized. Those skilled in the art will appreciate that interfacial resistance is of particular importance for low aspect ratio resistors. Another advantage of the resistor 10 is due to the terminals 22 and 24 being embedded in the lower surface of the resistive layer 26, with the lower surfaces of the terminals 22 and 24 being coplanar with the lower surface of the resistive layer 26 as a result of the resistive layer 26 being an additive layer on the dielectric layer 14. Accordingly, the highest current density between the terminals 22 and 24 is through a highly planar region of the resistive layer 26, which further promotes the predictability of the resistance value of the resistor 10 above that resulting from the large contact areas between the resistive layer 26 and the terminals 22 and 24.

Figure 3:
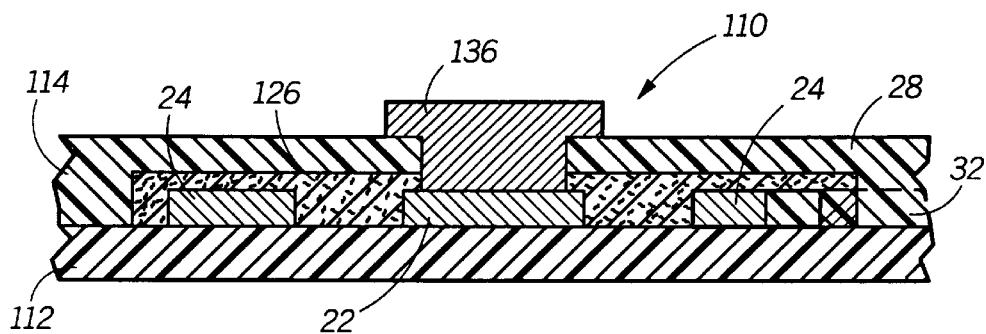

FIG. 3 illustrates a resistor 110 that is similar to that of FIG. 2, employing the same terminal pattern 20 of FIG. 1, a dielectric layer 112 on which the terminals 22 and 24 are formed and over which a resistive layer 126 is deposited, all of which is covered by a second dielectric layer 114. The resistor 110 of FIG. 3 differs from that of FIG. 2 primarily by the use of a contact 136 from the layer above to the inner terminal 22, formed through the resistive layer 126 and dielectric layer 114, as opposed to the contact 36 from the layer below shown in FIG. 2. The terminals 22 and 24 and the conductors 28 and 32 can be formed by any one of the techniques described for the embodiment of FIG. 2.

Figure 4:
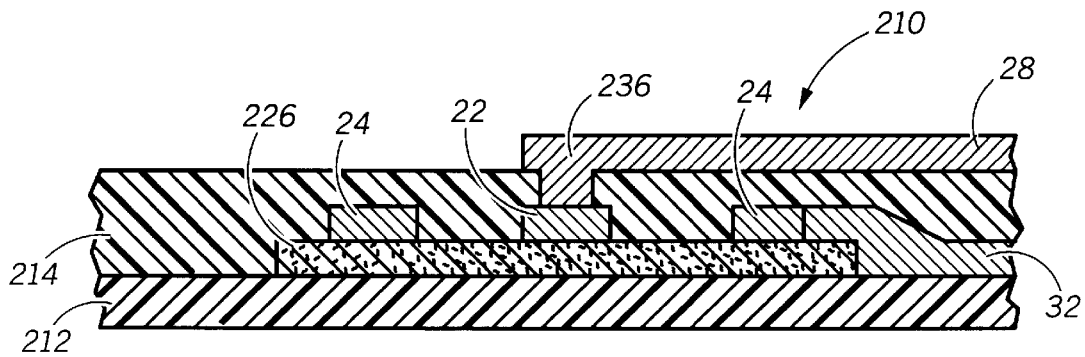

FIG. 4 illustrates another configuration for a thick-film resistor 210 in accordance with this invention. The resistor 210 differs from the resistor 110 of FIG. 2 by its placement of the terminals 22 and 24 on the surface of a resistive layer 226, as opposed to being embedded in the lower surface of the resistive layer 226 as done in the embodiments of FIGS. 2 and 3. Accordingly, the resistor 210 requires plating of the terminals 22 and 24 at the upper surface of the resistive layer 226. According to this invention, conventional resistor inks have been found to be rendered plateable by the same surface catalysis processes used to render dielectric layers plateable.

Figure 5:
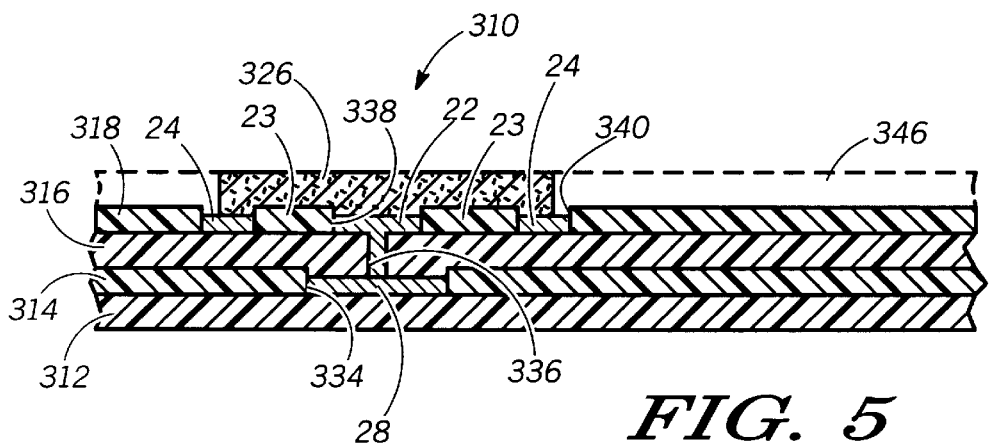

FIG. 5 shows a resistor 310 formed with multiple dielectric layers 312, 314, 316 and 318, yielding a multilayered structure in accordance with a fourth embodiment of the invention. As shown, the thick-film resistor 310 also employs the terminals 22 and 24 of FIG. 1, over which a resistive layer 326 is formed to electrically connect the terminals 22 and 24. The conductor 28 of FIG. 1 is shown as extending beneath the dielectric layers 316 and 318 and contacting the inner terminal 22. The terminals 22 and 24 and the conductor 28 are defined by openings in the dielectric layers 314 and 318. According to this embodiment of the invention, at least the dielectric layers 314 and 318 and preferably all of the dielectric layers 312, 314, 316 and 318 are formed of photodefinable materials, and the dielectric layers 312 and 316 are plateable. Again, the photodefinable and plateable resins disclosed in U.S. Pat. No. 5,162,144 to Brown et al. may be used to form the dielectric layers 312, 314, 316 and 318, though other resin compositions could be used. Furthermore, the resistor 310 shown in FIG. 5 could be formed by using the processes described above in reference to the embodiments of FIGS. 2 through 4.

If photodefinable and plateable resins are used, the resistor 310 of FIG. 5 is formed by depositing and curing a layer of an appropriate resin on a substrate to form the plateable dielectric layer 312. Afterwards, the photodefinable dielectric layer 314 is formed on the dielectric layer 312, and then photoimaged and developed to produce an opening 334 shown in FIG. 5. The surface of the dielectric layer 312 is then selectively plated with copper to form the conductor 28. The plateable dielectric layer 316 is then formed on the dielectric layer 314 and conductor 28, and subsequently photoimaged and developed to produce a contact 336 that exposes a portion of the conductor 28 as shown in FIG. 5. As portrayed in FIG. 1, the conductor 28 is also contacted by a conductive material deposited within the second via 42 (FIG. 1), which is formed in the dielectric layer 316. The photodefinable dielectric layer 318 is then formed on the dielectric layer 316, photoimaged and developed to produce openings or wells 338 and 340 in which the terminals 22 and 24 will be formed. The inner well 338 also exposes the contact 336 in the dielectric layer 316, while a third well (not shown) serves to expose the via 42 shown in FIG. 1. The exposed surfaces of the plateable dielectric layer 316 are then selectively plated with copper to form the terminals 22 and 24 and the conductor 32. Due to the precision of the photoimaging process, the terminals 22 and 24 are precisely formed in terms of their individual dimensions and their concentricity to each other. Finally, a screening mask 346 is used to deposit the thick-film resistive ink over the terminals 22 and 24 and a dielectric region 23 therebetween. The screening mask 346 can be a reusable template or stencil of a type known in the art.

Figure 6:
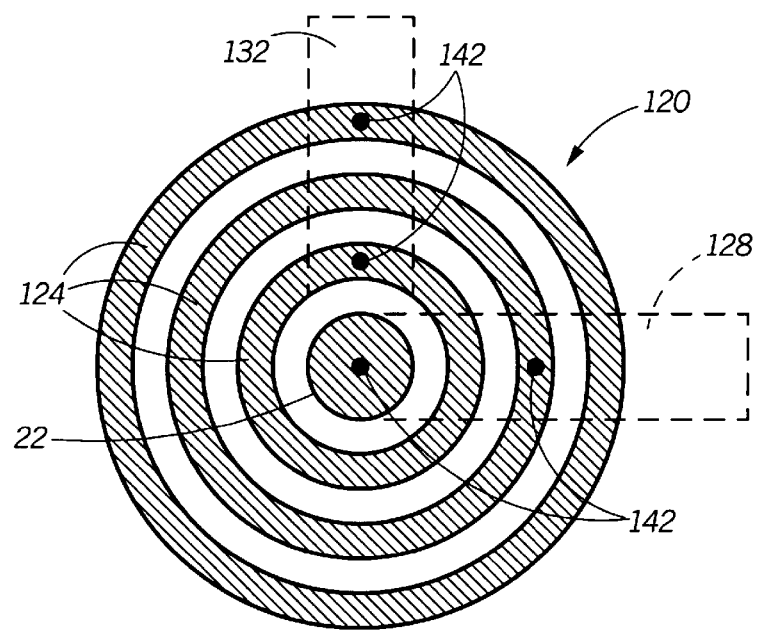
FIG. 6 is a plan view of parallel resistors formed by multiple concentric annular-shaped terminals and a single resistive layer in accordance with this invention.

While a single annular-shaped terminal (outer terminal 24) is shown in FIGS. 1 through 5, this invention encompasses the use of multiple concentric annular-shaped terminals 124 interconnected with vias 142 and conductors 128 and 132 to yield any number of parallel resistors using a single resistive layer (e.g., resistive layer 26 of FIG. 2), as shown in FIG. 6. Creating parallel resistors in this manner optimizes the aspect ratio obtainable with a given surface area to achieve a predictable and stable low resistance value. For example, using a terminal pattern 120 having multiple concentric annular-shaped terminals 124 as shown in FIG. 6, thick-film resistors having aspect ratios of 0.01 equivalent squares can be manufactured to have an outer diameter of about one millimeter using a metallization resolution capability of about 75 μm lines and spaces and 125 μm via pads. Such conditions enable a circuit to be produced with thick-film resistors covering three decades of resistance values (i.e., 0.01 to 10 squares) using a single thick-film ink. This capability substantially reduces costs and improves predictability across the range of resistors produced.

While our invention has been described in terms of particular embodiments, it is apparent that other forms could be adopted by one skilled in the art. For example, the terminals and conductors of the resistors could be formed using methods other than those discussed. Furthermore, while dielectric layers formed by photosensitive resins have been described, nonphotosensitive resins could be employed to form the dielectric layers, with wells and vias being formed by such known methods as laser and plasma etching. Accordingly, the scope of our invention is to be limited only by the following claims.

What is claimed is:

1. A method for forming a thick-film resistor, the method comprising the steps of:

forming first and second terminals on a dielectric layer, the second terminal surrounding the first terminal and being separated from the first terminal by a surface region of the dielectric layer, the second terminal and the surface region of the dielectric layer having concentric annular shapes; and then printing a thick-film resistive ink on the dielectric layer to form an electrically resistive layer that completely covers the first and second terminals, such that each of the first and second terminals has a surface that contacts the resistive layer; and then heating the resistive layer to form a thick-film resistor terminated by the first and second terminals.

2. A method as recited in claim 1, wherein the dielectric layer is formed as part of a printed circuit board.

3. A method as recited in claim 1, wherein the thick-film resistor has dimensions of 100 micrometers and smaller.

4. A method as recited in claim 1, wherein the dielectric layer overlies a conductor, the method further comprising the step of providing an electrical connection between the conductor and the first terminal.

5. A method as recited in claim 1, further comprising the step of providing an electrical connection through the resistive layer to the first terminal.

6. A method as recited in claim 1, further comprising the step of forming at least a third terminal on the dielectric layer, the third terminal surrounding the first and second terminals and being separated from the second terminal so as to define an annular-shaped region of the resistive layer between the second and third terminals, the third terminal being electrically connected to the resistive layer.

7. A method as recited in claim 6, further comprising the step of forming a fourth terminal on the dielectric layer, the fourth terminal surrounding the first, second and third terminals and being separated from the third terminal so as to define a second annular-shaped region of the resistive layer between the third and fourth terminals, the fourth terminal being electrically connected to the third terminal through the resistive layer so as to define a second thick-film resistor with the resistive layer that is electrically parallel to the thick-film resistor terminated by the first and second terminals.

8. A method as recited in claim 1, wherein the first and second terminals are formed on the dielectric layer by a process chosen from the group consisting of (a) catalyzing the dielectric layer, electrolessly plating the dielectric layer, applying a resist to the electrolessly plated dielectric layer, and then electroplating the electrolessly plated dielectric layer, (b) catalyzing the dielectric layer, electrolessly plating the dielectric layer, electroplating the electrolessly plated dielectric layer to form an electroplated layer, applying a resist to the electroplated layer, and then etching the electroplated layer, and (c) laminating a metal foil to the dielectric layer and then etching the laminated metal foil.

9. A method for forming a thick-film resistor, the method comprising the steps of:

printing a thick-film resistive ink on a first dielectric layer to form an electrically resistive layer on the first dielectric layer;

forming first and second terminals entirely on a surface of the resistive layer such that each of the first and second terminals has a surface that contacts the resistive layer, the second terminal surrounding the first terminal and being separated from the first terminal by a region of the surface of the resistive layer, the second terminal and the surface region of the resistive layer having concentric annular shapes;

forming a second dielectric layer that completely covers the resistive layer and the first and second terminals; and then heating the resistive layer to form a thick-film resistor terminated by the first and second terminals.

10. A method as recited in claim 9, wherein the first and second terminals are plated on the resistive layer.

11. A method as recited in claim 9, further comprising the step of providing an electrical connection through the second dielectric layer to the first terminal.

12. A method as recited in claim 9, further comprising the step of forming third and fourth terminals on the resistive layer, the third terminal surrounding the first and second terminals and being separated from the second terminal so as to define an annular-shaped region of the resistive layer between the second and third terminals, the fourth terminal surrounding the first, second and third terminals and being separated from the third terminal so as to define a second annular-shaped region of the resistive layer between the third and fourth terminals, the fourth terminal being electrically connected to the third terminal through the resistive layer so as to define a second thick-film resistor with the resistive layer that is electrically parallel to the thick-film resistor terminated by the first and second terminals.

13. A method as recited in claim 9, wherein the first dielectric layer is formed as part of a printed circuit board.

14. A method as recited in claim 9, wherein the thick-film resistor has dimensions of 100 micrometers and smaller.

15. A method for forming a thick-film resistor, the method comprising the steps of:

forming a dielectric layer on a dielectric substrate;

patterning and developing first and second openings in the dielectric layer, the second opening surrounding the first opening and being separated from the first opening by a remaining portion of the dielectric layer, the second opening and the remaining portion of the dielectric layer having concentric annular shapes;

plating first and second terminals within the first and second openings, respectively, of the dielectric layer, the second terminal surrounding the first terminal and being separated from the first terminal by the remaining portion of the dielectric layer;

printing a thick-film resistive ink on the dielectric layer to form an electrically resistive layer that overlays the first and second terminals and the remaining portion of the dielectric layer, each of the first and second terminals having a surface that contacts the resistive layer; and then heating the resistive layer to form a thick-film resistor terminated by the first and second terminals.

16. A method as recited in claim 15, wherein the first and second terminals are plated on the dielectric substrate.

17. A method as recited in claim 15, further comprising the step of providing an electrical connection through the dielectric substrate to the first terminal.

18. A method as recited in claim 15, further comprising the steps of:

prior to the plating step, patterning and developing third and fourth openings in the dielectric layer, the third opening surrounding the second opening and being separated from the second opening by a second remaining portion of the dielectric layer, the fourth opening surrounding the third opening and being separated from the third opening by a third remaining portion of the dielectric layer, the third and fourth openings and the second and third remaining portions of the dielectric layer having concentric annular shapes;

during the plating step, plating third and fourth terminals within the third and fourth openings, respectively, of the dielectric layer, the third terminal surrounding the second terminal and being separated from the second terminal by the second remaining portion of the dielectric layer, the fourth terminal surrounding the third terminal and being separated from the third terminal by the third remaining portion of the dielectric layer;

during the printing step, printing the thick-film resistive ink on the dielectric layer so that the resistive layer also overlays the third and fourth terminals and the second and third remaining portions of the dielectric layer, each of the third and fourth terminals having a surface that contacts the resistive layer; and then wherein the heating step yields a second thick-film resistor terminated by the third and fourth terminals and electrically parallel to the thick-film resistor terminated by the first and second terminals.

19. A method as recited in claim 15, wherein the dielectric substrate is formed as part of a printed circuit board.

20. A method as recited in claim 15, wherein the thick-film resistor has dimensions of 100 micrometers and smaller.

* * * * *